(12) United States Patent
Cheng et al.

(10) Patent No.: US 10,103,063 B2
(45) Date of Patent: *Oct. 16, 2018

(54) FORMING A HYBRID CHANNEL NANOSHEET SEMICONDUCTOR STRUCTURE

(71) Applicant: International Business Machines Corporation, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/690,601

(22) Filed: Aug. 30, 2017

(65) Prior Publication Data

US 2018/0076095 A1  Mar. 15, 2018

Related U.S. Application Data

(63) Continuation of application No. 15/465,989, filed on Mar. 22, 2017, now Pat. No. 9,881,839, which is a (Continued)

(51) Int. Cl.
*H01L 21/8238* (2006.01)
*H01L 27/092* (2006.01)
(Continued)

(52) U.S. Cl.
CPC ............. *H01L 21/823807* (2013.01); *H01L 21/02532* (2013.01); *H01L 21/02603* (2013.01);
(Continued)

(58) Field of Classification Search
CPC ....... H01L 21/823807; H01L 29/66553; H01L 21/28079; H01L 21/02532;
(Continued)

(56) References Cited

U.S. PATENT DOCUMENTS 7,893,492 B2  2/2011  Bedell et al.
8,017,464 B2  9/2011  Sugiyama et al.
(Continued)

OTHER PUBLICATIONS

U.S. Appl. No. 15/008,615 filed in the name of M.A. Bergendahl et al. dated Jan. 28, 2016 and entitled "Forming Stacked Nanowire Semiconductor Device."

(Continued)

*Primary Examiner* — Bo Fan
(74) *Attorney, Agent, or Firm* — Vazken Alexanian; Ryan, Mason & Lewis, LLP

(57) ABSTRACT

A method for fabricating a nanosheet semiconductor structure includes forming a first nanosheet field effect transistor (FET) structure having a first inner spacer comprised of a first material and a second nanosheet FET structure having second inner spacer comprised of a second material. The first material is different than the second material. The first nanosheet FET structure is formed by creating a first inner spacer formation within a first silicon germanium (SiGe) channel, wherein the first SiGe channel is comprised in a first channel region of a first FET region. The second nanosheet FET structure is formed by creating a second inner spacer formation within a second SiGe channel, wherein the second SiGe channel is comprised in a second channel region of a second FET region.

18 Claims, 17 Drawing Sheets

Related U.S. Application Data continuation of application No. 15/260,509, filed on Sep. 9, 2016, now Pat. No. 9,704,863.

(51) Int. Cl.
| | |
|---|---|
| *H01L 29/06* | (2006.01) |
| *H01L 21/308* | (2006.01) |
| *H01L 21/306* | (2006.01) |
| *H01L 29/66* | (2006.01) |
| *H01L 21/02* | (2006.01) |
| *H01L 21/28* | (2006.01) |

(52) U.S. Cl.
CPC .... *H01L 21/28079* (2013.01); *H01L 21/3085* (2013.01); *H01L 21/30604* (2013.01); *H01L 21/30625* (2013.01); *H01L 21/823828* (2013.01); *H01L 21/823885* (2013.01); *H01L 27/092* (2013.01); *H01L 29/0669* (2013.01); *H01L 29/66545* (2013.01); *H01L 29/66553* (2013.01)

(58) Field of Classification Search
CPC ......... H01L 21/02603; H01L 29/66545; H01L 21/30625; H01L 21/30604; H01L 21/3085; H01L 21/823828; H01L 21/823885; H01L 29/0669
USPC .......... 257/29, 351, 401, 192, 288; 438/283, 438/285, 288
See application file for complete search history.

(56) References Cited

U.S. PATENT DOCUMENTS

| | | | |
|---|---|---|---|
| 8,084,308 | B2 | 12/2011 | Chang et al. |
| 8,361,297 | B2 | 1/2013 | Mayer et al. |
| 9,123,567 | B2 | 9/2015 | Radosavljevic et al. |
| 9,129,829 | B2 | 9/2015 | Kuhn et al. |
| 9,196,479 | B1* | 11/2015 | Cheng ............. H01L 21/823807 |
| 9,362,355 | B1* | 6/2016 | Cheng ............... H01L 29/66742 |
| 2009/0242405 | A1 | 10/2009 | Mayer et al. |
| 2010/0078690 | A1 | 4/2010 | Sugiyama et al. |
| 2014/0335673 | A1* | 11/2014 | Kim .................. H01L 29/66545 438/283 |
| 2015/0228480 | A1 | 8/2015 | Yin et al. |
| 2015/0236120 | A1 | 8/2015 | Hashemi et al. |
| 2015/0255606 | A1* | 9/2015 | Cheng ................. H01L 29/7848 257/192 |
| 2015/0364542 | A1* | 12/2015 | Rodder .................. B82Y 10/00 257/29 |
| 2016/0027929 | A1 | 1/2016 | Cheng et al. |
| 2016/0071729 | A1 | 3/2016 | Hatcher et al. |
| 2016/0181412 | A1* | 6/2016 | Kwon ................... H01L 27/088 257/401 |
| 2016/0204131 | A1* | 7/2016 | Cheng ................ H01L 27/1211 257/351 |

OTHER PUBLICATIONS

List of IBM Patents or Patent Applications Treated as Related.

* cited by examiner

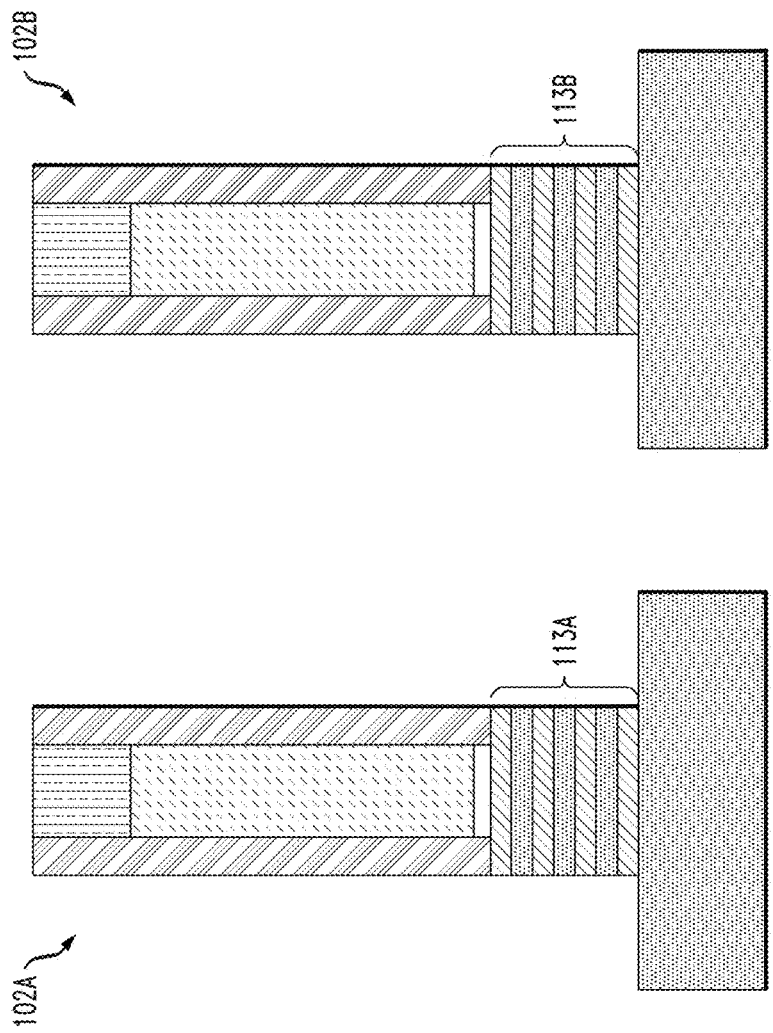

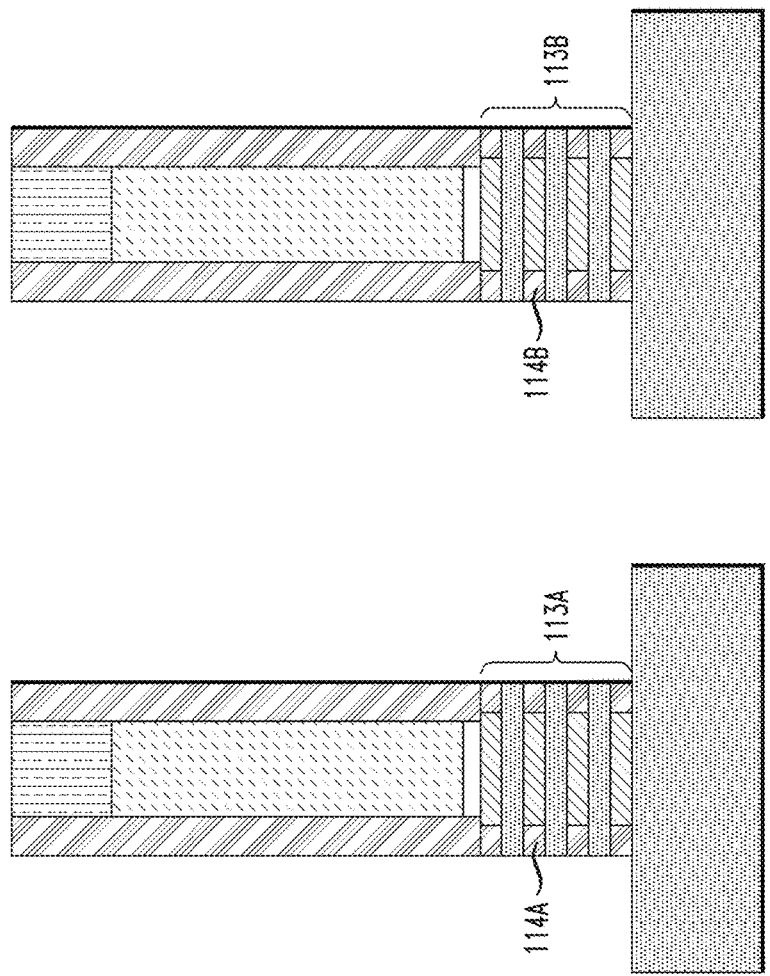

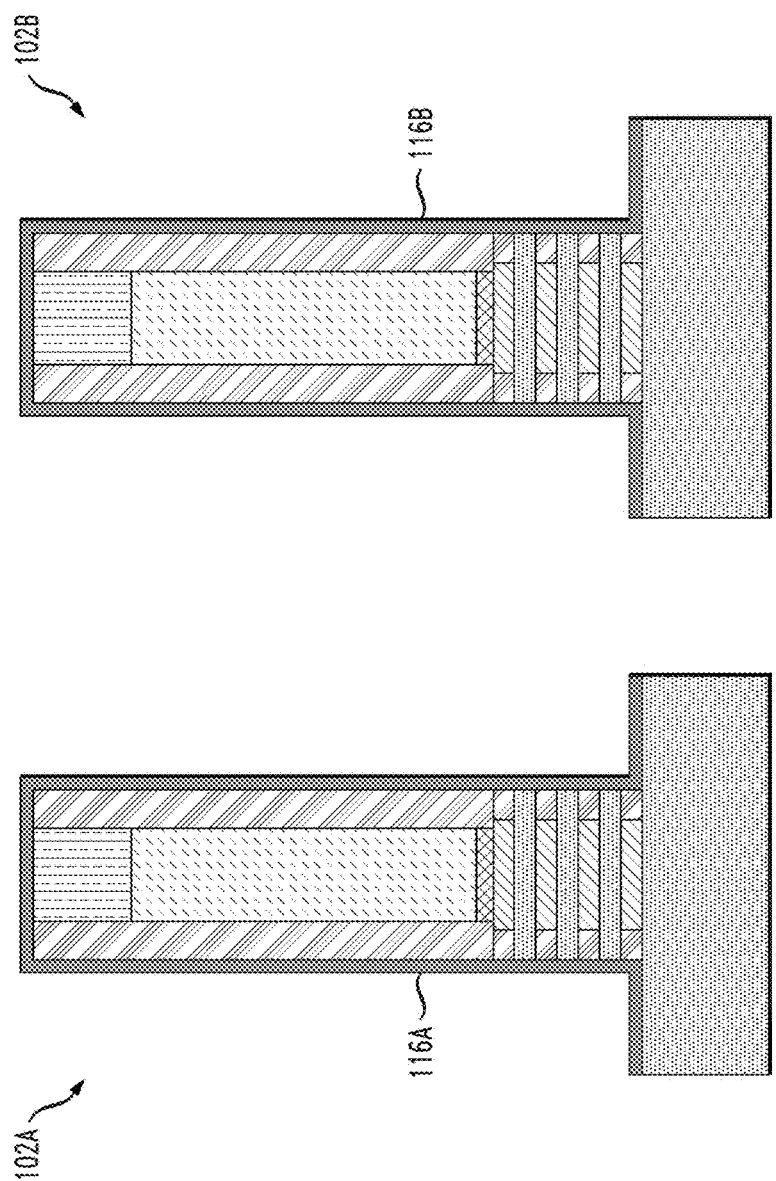

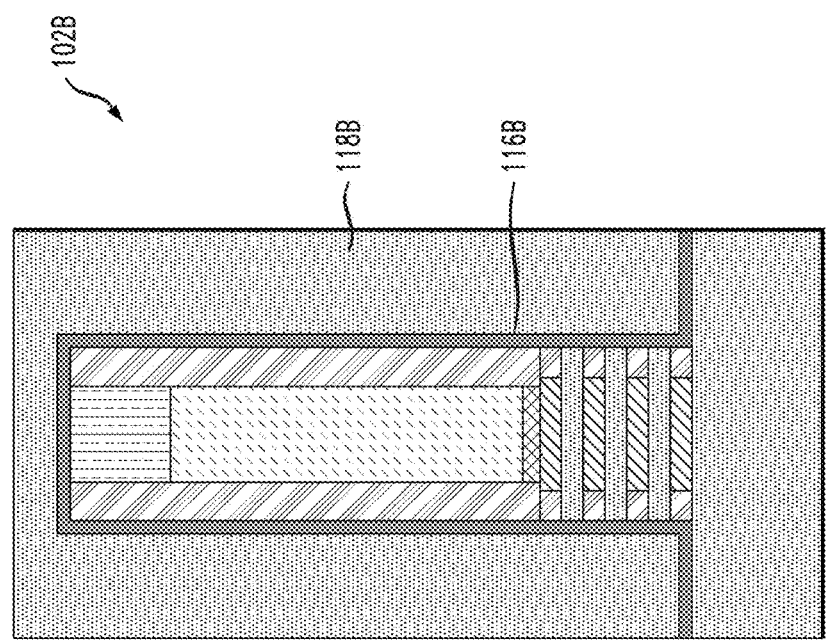
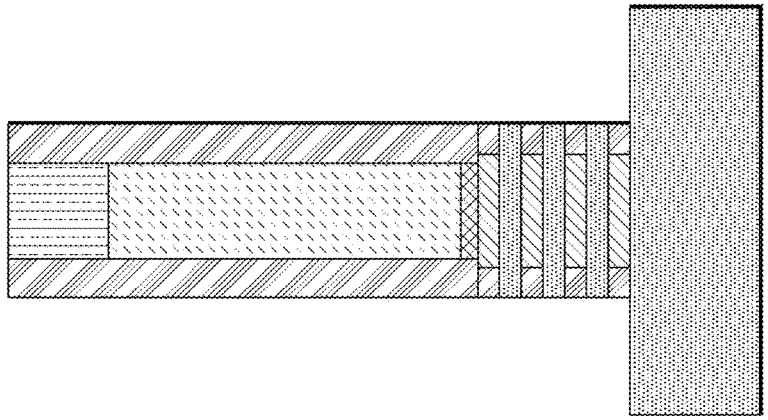
FIG. 1F

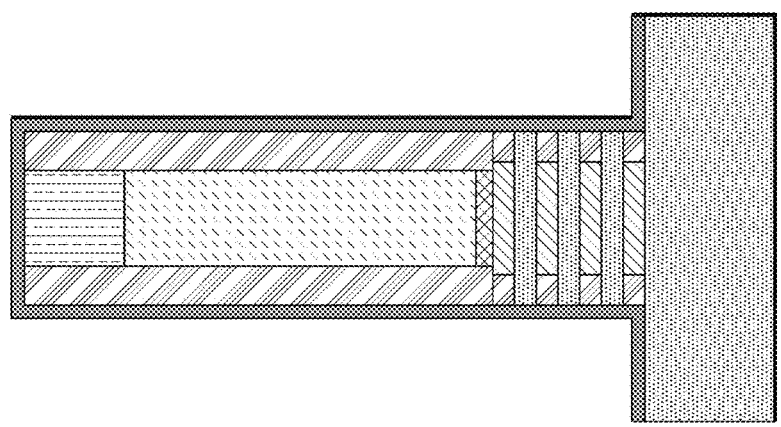
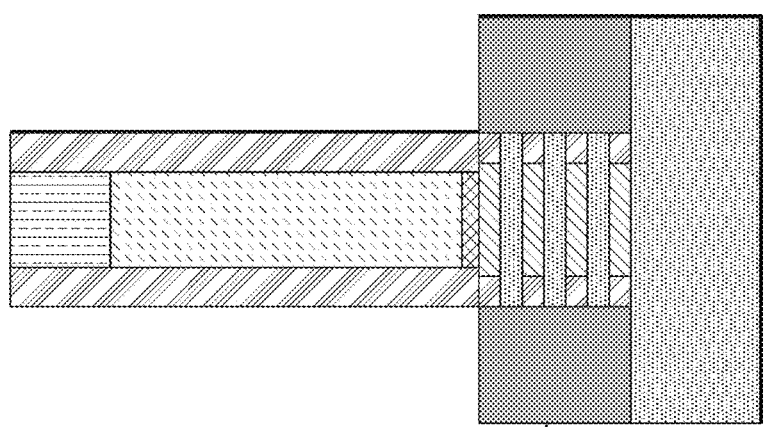
FIG. 1G

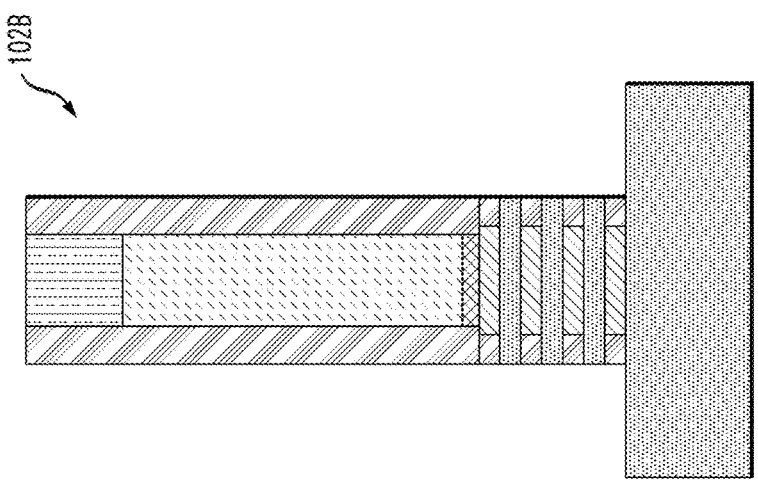
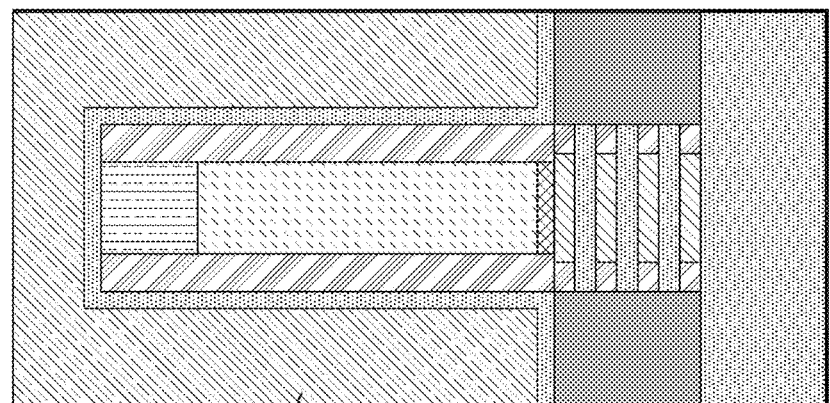
FIG. 1I

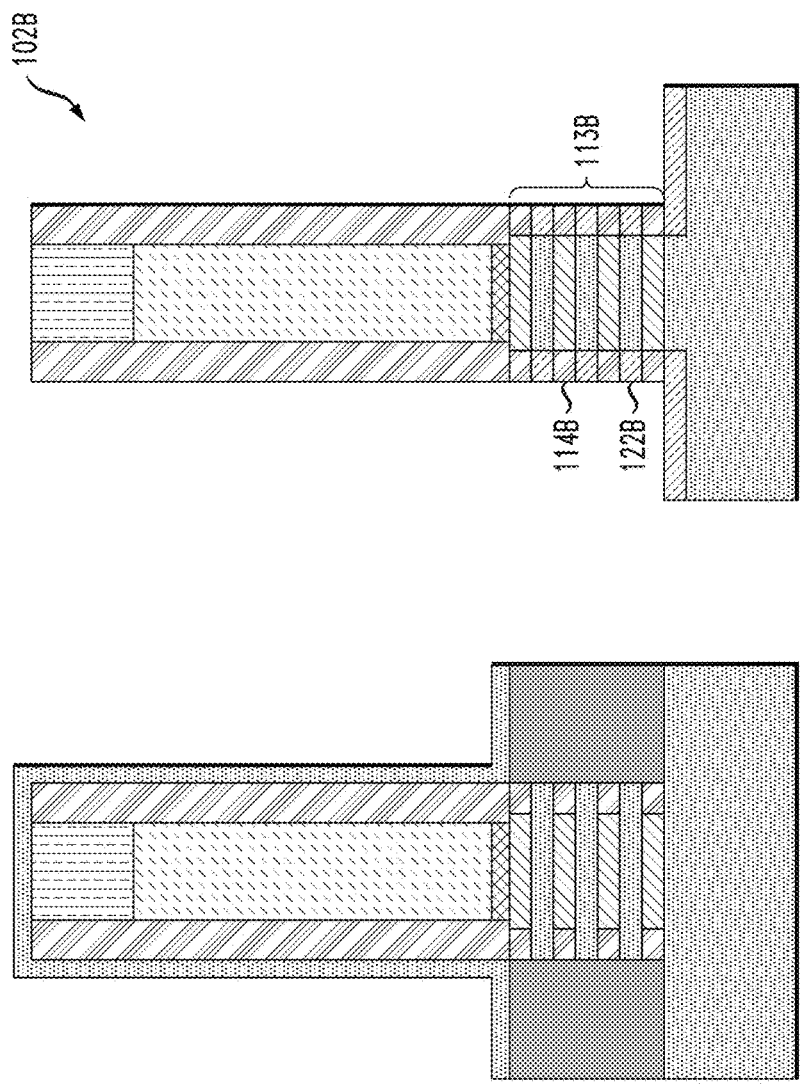
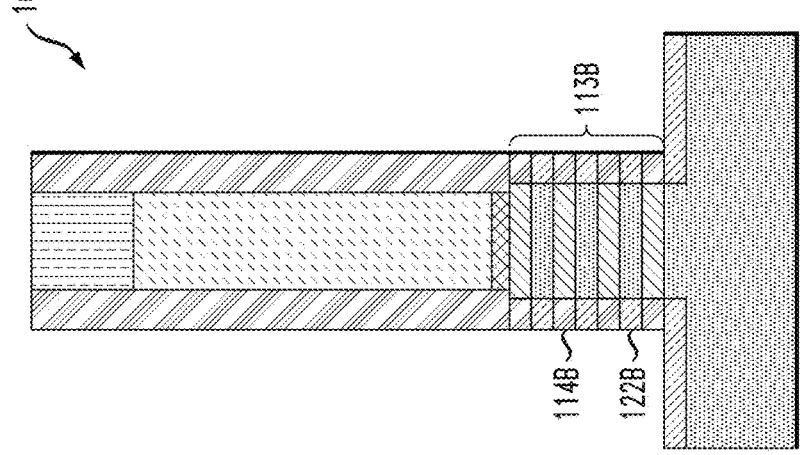
FIG. 1J

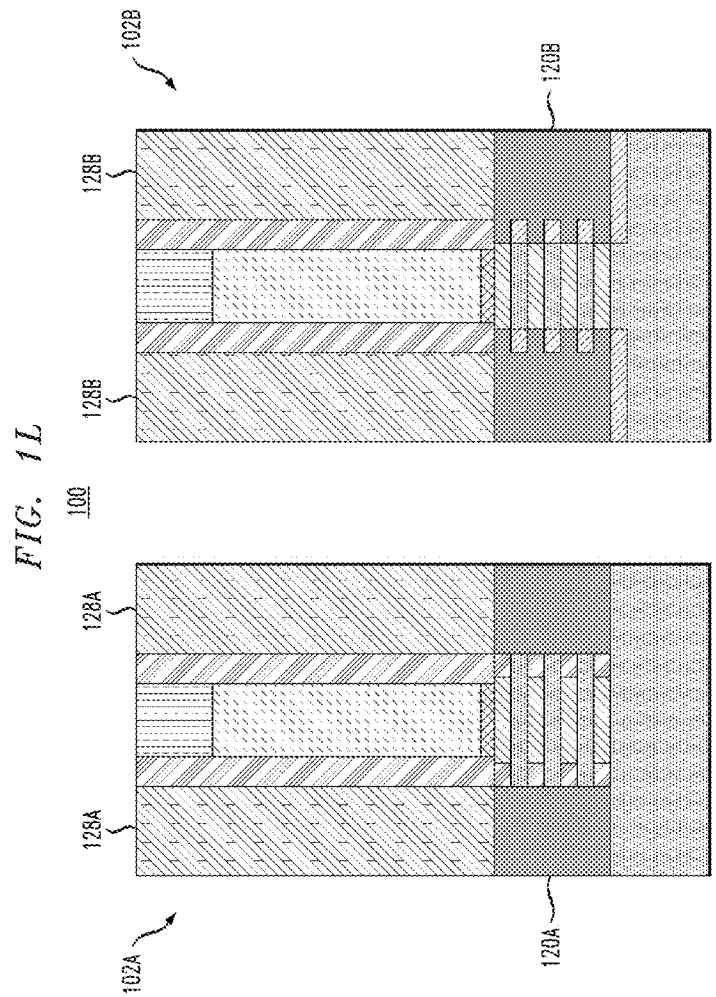

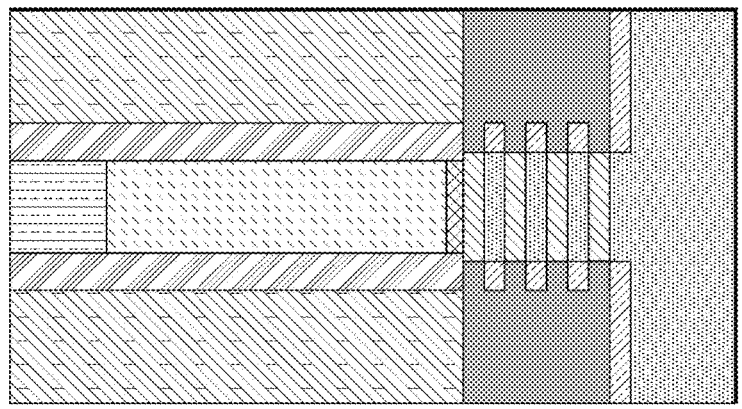
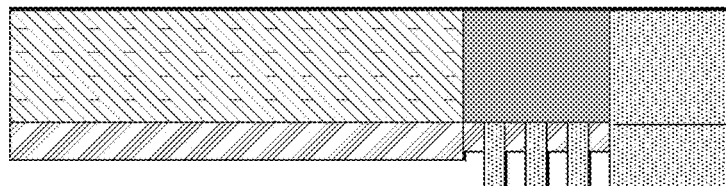
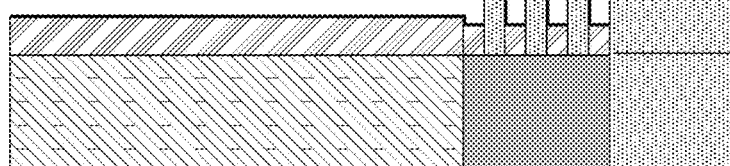
FIG. 1M

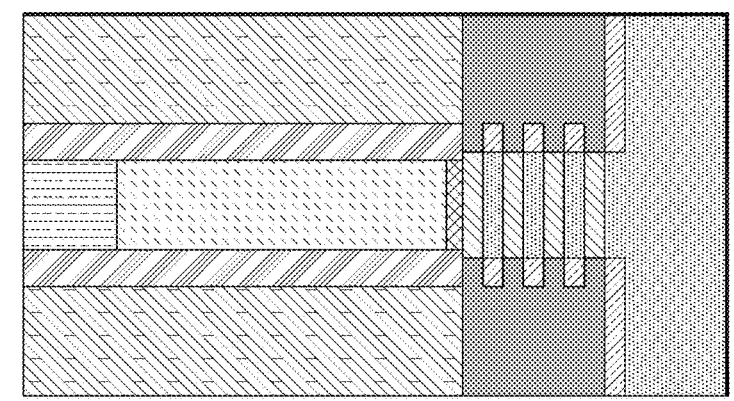
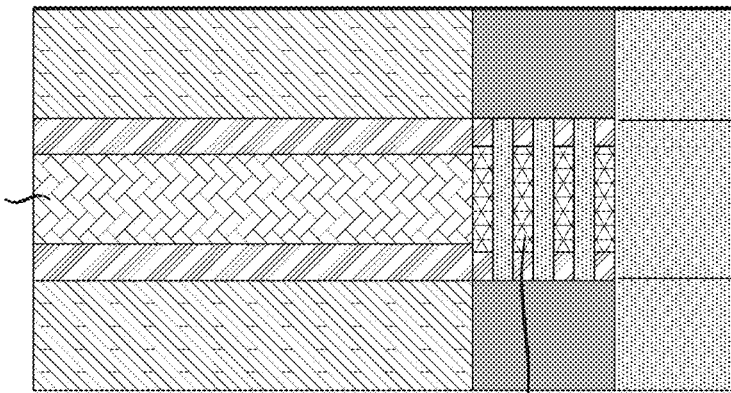
FIG. 1N
100

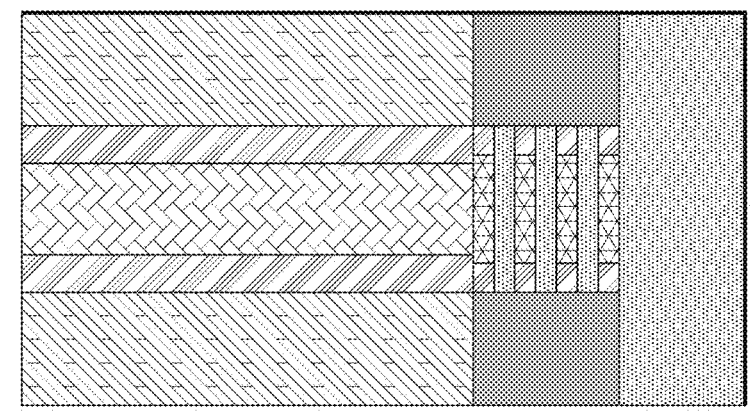

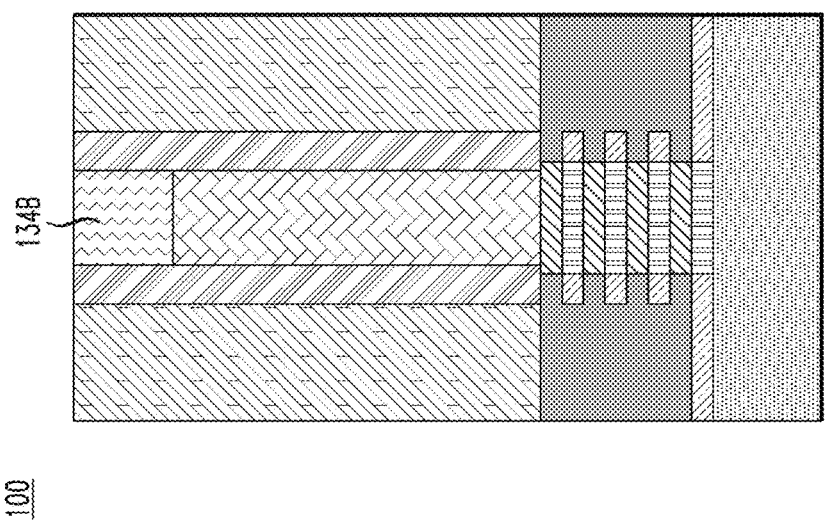
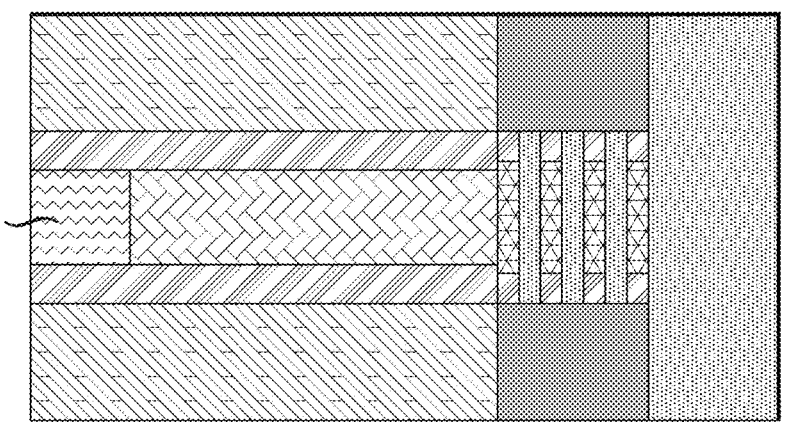
FIG. 1Q

US 10,103,063 B2

FORMING A HYBRID CHANNEL NANOSHEET SEMICONDUCTOR STRUCTURE

BACKGROUND

Semiconductor structures or devices may be embodied as field effect transistors (FETs), such as metal-oxide-semiconductor FETs (MOSFETs). One or more such FETs may comprise an integrated circuit (IC or chip). As ICs are being scaled to smaller dimensions, stacked nanosheet FETs, or nanosheet FETs, have been developed to increase effective conduction width in a given area. A nanosheet is a nanostructure with a thickness in a scale ranging from, e.g., about 1 to 100 nanometers (nm). A nanosheet FET is a FET that is formed by stacking multiple such nanostructures.

SUMMARY

Illustrative embodiments of the invention provide techniques for fabricating nanosheet semiconductor structures.

For example, in one embodiment, a method for forming a nanosheet semiconductor structure comprises forming a first nanosheet field effect transistor (FET) structure having a first inner spacer comprised of a first material and a second nanosheet FET structure having a second inner spacer comprised of a second material. The first material is different than the second material. In one example, the first nanosheet FET structure is an n-type FET structure and the second nanosheet FET structure is a p-type FET structure. The first nanosheet FET structure and the second nanosheet FET structure are collectively formed to construct a hybrid channel nanosheet semiconductor structure.

While illustrative embodiments are described herein with respect to hybrid channel nanosheet FETs, alternative embodiments may be implemented with other types of semiconductor structures.

For example, the forming step of the first nanosheet FET structure further includes creating a first inner spacer formation within a first silicon germanium (SiGe) channel, wherein the first SiGe channel is comprised in a first channel region of a first FET region. The second nanosheet FET structure is further formed by creating a second inner spacer formation within a second SiGe channel, wherein the second SiGe channel is comprised in a second channel region of a second FET region.

For example, the forming step further comprises creating a first inner spacer formation within a first silicon germanium (SiGe) channel comprised in a first channel region of a first FET region, and a second inner spacer formation within a second SiGe channel comprised in a second channel region of a second FET region. The first SiGe channel is formed from one or more SiGe nanosheets and the second SiGe channel is formed from one or more second SiGe nanosheets. A first sacrificial liner is deposited on the first FET region and a second sacrificial liner is deposited on the second FET region. A mask is formed on the second sacrificial liner, and a source/drain region is formed on a first silicon (Si) channel of the first channel region. The first Si channel is formed from one or more first Si nanosheets. The mask and the first and second sacrificial liners are removed. A third inner spacer formation is created within a second Si channel comprised in the second channel region, and a source/drain region is formed on the second SiGe channel. The second Si channel is formed from one or more second Si nanosheets. The first source/drain region is filled with a first oxide and the second source/drain region is filled with a second oxide. A first gate of the first FET region is replaced with a first metal and the first SiGe channel is replaced with a first work function metal. A second gate of the second FET region is replaced with a second metal and the second Si channel is replaced with a second work function metal.

By way of further example, creating the first inner spacer formation comprises forming a first divot within the first SiGe channel and filling the first divot with a first ceramic material, and creating the second inner spacer formation comprises forming a second divot within the second SiGe channel and filling the second divot with a second ceramic material. For example, the first and/or ceramic material may be comprised of silicon-boron-carbide-nitride (SiBCN). In one illustrative embodiment, creating the third inner spacer region comprises forming a divot within the second Si channel and filling the divot with a silicate glass. For example, the silicate glass may be silicon oxycarbide (SiCO).

BRIEF DESCRIPTION OF THE DRAWINGS

FIG. 1C is a schematic cross-sectional side view of a portion of a semiconductor device at a third-intermediate fabrication stage, according to an embodiment of the invention.

FIG. 1D is a schematic cross-sectional side view of a portion of a semiconductor device at a fourth-intermediate fabrication stage, according to an embodiment of the invention.

FIG. 1E is a schematic cross-sectional side view of a portion of a semiconductor device at a fifth-intermediate fabrication stage, according to an embodiment of the invention.

FIG. 1F is a schematic cross-sectional side view of a portion of a semiconductor device at a sixth-intermediate fabrication stage, according to an embodiment of the invention.

FIG. 1G is a schematic cross-sectional side view of a portion of a semiconductor device at a seventh-intermediate fabrication stage, according to an embodiment of the invention.

FIG. 1I is a schematic cross-sectional side view of a portion of a semiconductor device at a ninth-intermediate fabrication stage, according to an embodiment of the invention.

FIG. 1J is a schematic cross-sectional side view of a portion of a semiconductor device at a tenth-intermediate fabrication stage, according to an embodiment of the invention.

FIG. 1L is a schematic cross-sectional side view of a portion of a semiconductor device at a twelfth-intermediate fabrication stage, according to an embodiment of the invention.

FIG. 1M is a schematic cross-sectional side view of a portion of a semiconductor device at a thirteenth-intermediate fabrication stage, according to an embodiment of the invention.

FIG. 1N is a schematic cross-sectional side view of a portion of a semiconductor device at a fourteenth-intermediate fabrication stage, according to an embodiment of the invention.

FIG. 1O is a schematic cross-sectional side view of a portion of a semiconductor device at a fifteenth-intermediate fabrication stage, according to an embodiment of the invention.

FIG. 1P is a schematic cross-sectional side view of a portion of a semiconductor device at a sixteenth-intermediate fabrication stage, according to an embodiment of the invention.

FIG. 1Q is a schematic cross-sectional side view of a portion of a semiconductor device at a seventeenth-intermediate fabrication stage, according to an embodiment of the invention.

DETAILED DESCRIPTION

In illustrative embodiments, techniques are provided for fabricating semiconductor devices comprised of one or more FETs. More particularly, illustrative embodiments provide techniques for fabricating semiconductor devices comprised of one or more hybrid channel nanosheet FETS. As will be explained in illustrative embodiments, such fabrication techniques advantageously improve performance of semiconductor devices.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

Figure 1A:
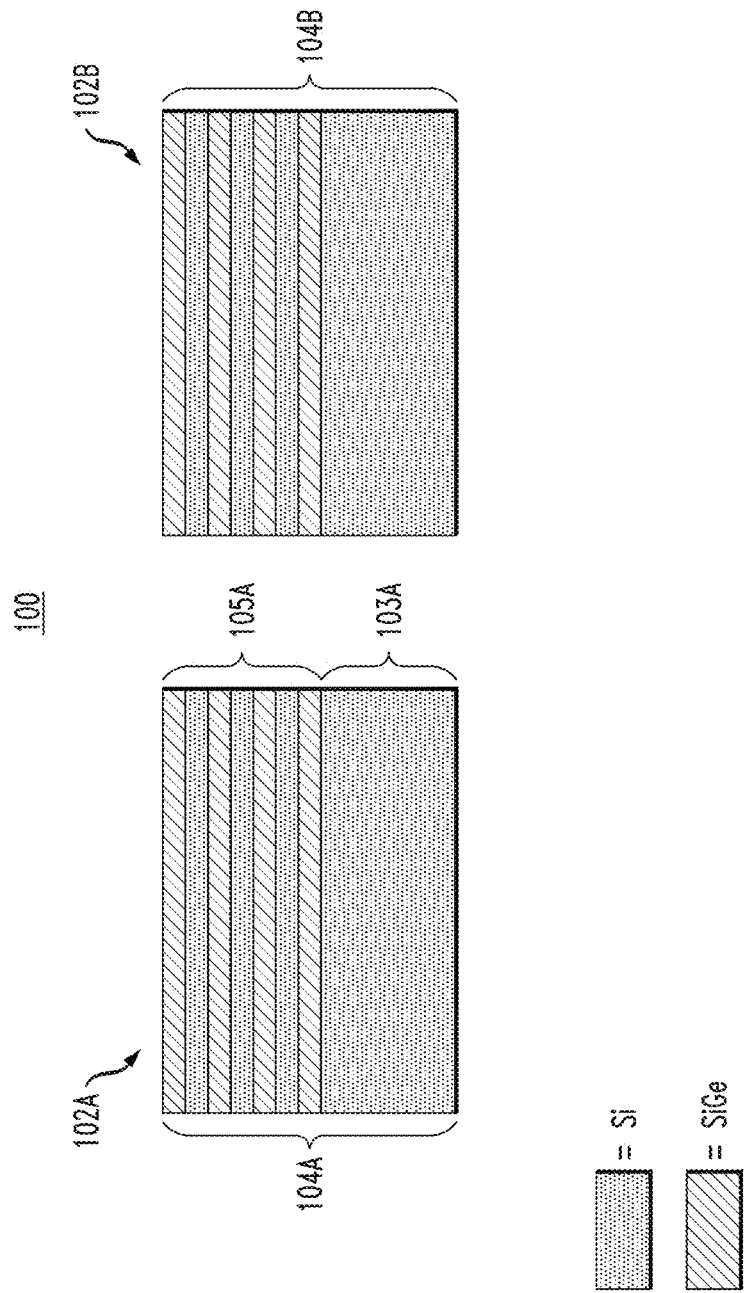
FIG. 1A is a schematic cross-sectional side view of a portion of a semiconductor device at a first-intermediate fabrication stage, according to an embodiment of the invention.

FIGS. 1A-1Q illustrate an exemplary process for fabricating a semiconductor structure for increasing control of fin reveal in a dense fin region. FIG. 1A illustrates a semiconductor structure 100 at a first-intermediate fabrication stage. For the purpose of clarity, several fabrication steps leading up to the production of the semiconductor structure 100 as illustrated in FIG. 1A are omitted. In other words, semiconductor structure 100 does not necessarily start out in the form illustrated in FIG. 1A, but may develop into the illustrated structure over one or more well-known processing steps which are not illustrated but are well-known to those of ordinary skill in the art. Also, note that the same reference numeral (100) is used to denote the semiconductor structure through the various intermediate fabrication stages illustrated in FIGS. 1A through 1K. Note also that semiconductor structure 100 can also be considered to be a semiconductor device and/or an integrated circuit, or some part thereof.

Semiconductor structure 100 in FIG. 1A is shown having n-FET region 102A comprising stack 104A and p-FET region 102B comprising stack 104B. Each stack is comprised of a substrate and alternating nanosheets of material arranged on the substrate. In one embodiment, each nanosheet may have a thickness ranging from about 1 nm to about 100 nm. For example, as shown in this illustrative embodiment, stack 104A is comprised of substrate 103A and nanosheets 105A. In one embodiment, and as shown, substrate 103A is comprised of silicon (Si). As shown, nanosheets 105A may comprise alternating nanosheets comprised of silicon-germanium (SiGe) and nanosheets comprised of Si. It is to be understood that the arrangement of SiGe and Si nanosheets on the substrate, including the number of nanosheets, is purely exemplary and should not be considered limiting.

Figure 1B:
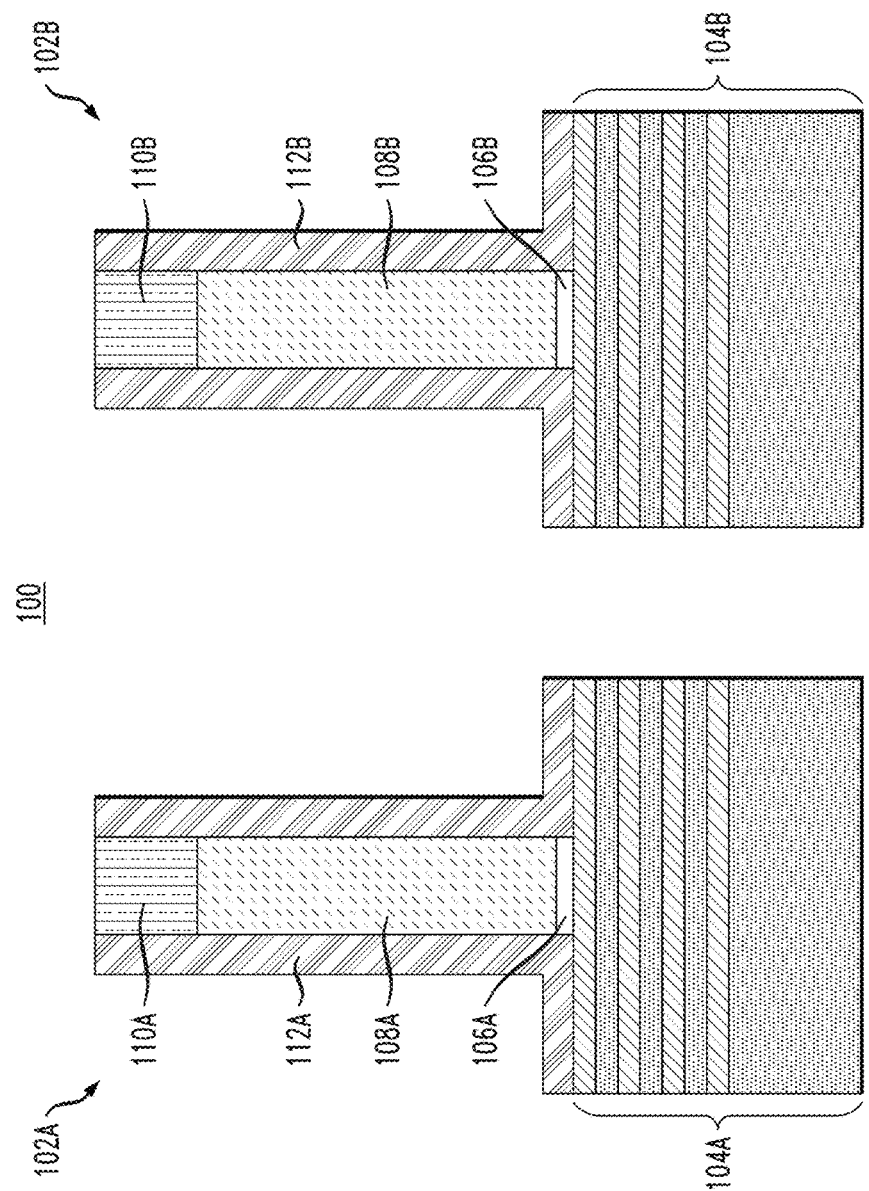
FIG. 1B is a schematic cross-sectional side view of a portion of a semiconductor device at a second-intermediate fabrication stage, according to an embodiment of the invention.

FIG. 1B illustrates semiconductor structure 100 at a second-intermediate fabrication stage. During this stage, pad insulator 106A is formed on stack 104A, and pad insulator 106B is formed on stack 104B. Gate 108A is formed on pad insulator 106A and gate 108B is formed on pad insulator 106B. Gate hard mask 110A is formed on gate 108A and gate hard mask 110B is formed on gate 108B. Spacer 112A is deposited along n-FET region 102A and spacer 112B is deposited along p-FET region 102B, as shown in FIG. 1B. Accordingly, gate formation and spacer deposition occur in the fabrication stage illustrated in FIG. 1B.

FIG. 1C illustrates semiconductor structure 100 at a third-intermediate fabrication stage. During this stage, n-FET region 102A and p-FET region 102B are each etched as shown to form channel regions 113A and 113B. Accordingly, the nanosheets of each FET region form respective channel regions of the semiconductor structure.

FIG. 1D illustrates semiconductor structure 100 at a fourth-intermediate fabrication stage. During this stage, divots are created within channel region 113A and channel region 113B via an etching process (e.g., an isotropic etching process), and each divot is filled with an inner spacer. For example, as shown, the divots of channel region 113A are filled with inner spacer 114A, and the divots of channel region 113B are filled with inner spacer 114B. In one embodiment, inner spacer 114A and inner spacer 114B are comprised of a ceramic material. For example, inner spacer 114A and/or inner spacer 114B may be comprised of silicon-boron-carbide-nitride (SiBCN). However, any suitable material may be implemented for use as an inner spacer in accordance with the embodiments described herein.

FIG. 1E illustrates semiconductor structure 100 at a fifth-intermediate fabrication stage. During this stage, sacrificial liner 116A is deposited on n-FET region 102A and sacrificial liner 116B is deposited on p-FET region 102B. In one embodiment, sacrificial liners 116A and 116B are comprised of a ceramic material. For example, sacrificial liners 116A and/or 116B may be comprised of SiBCN. However, any suitable material may be implemented for use as a sacrificial liner in accordance with the embodiments described herein.

FIG. 1F illustrates semiconductor structure 100 at a sixth-intermediate fabrication stage. During this stage, mask 118B is patterned on sacrificial liner 116B. The function of mask 118 is to protect p-FET region 102B. After mask 118 is patterned on sacrificial liner 116B, sacrificial liner 116A is removed.

FIG. 1G illustrates semiconductor structure 100 at a seventh-intermediate fabrication stage. During this stage, the source/drain region 120A of n-FET region 102A is created by growing an epitaxial layer along the Si channel of channel region 113A of n-FET region 102A, as shown. In one embodiment, the epitaxial layer along the Si channel of channel region 113A is grow via high temperature epitaxy with phosphorus (P) implantation. Additionally, mask 118B is removed from p-FET region 102B.

Figure 1H:
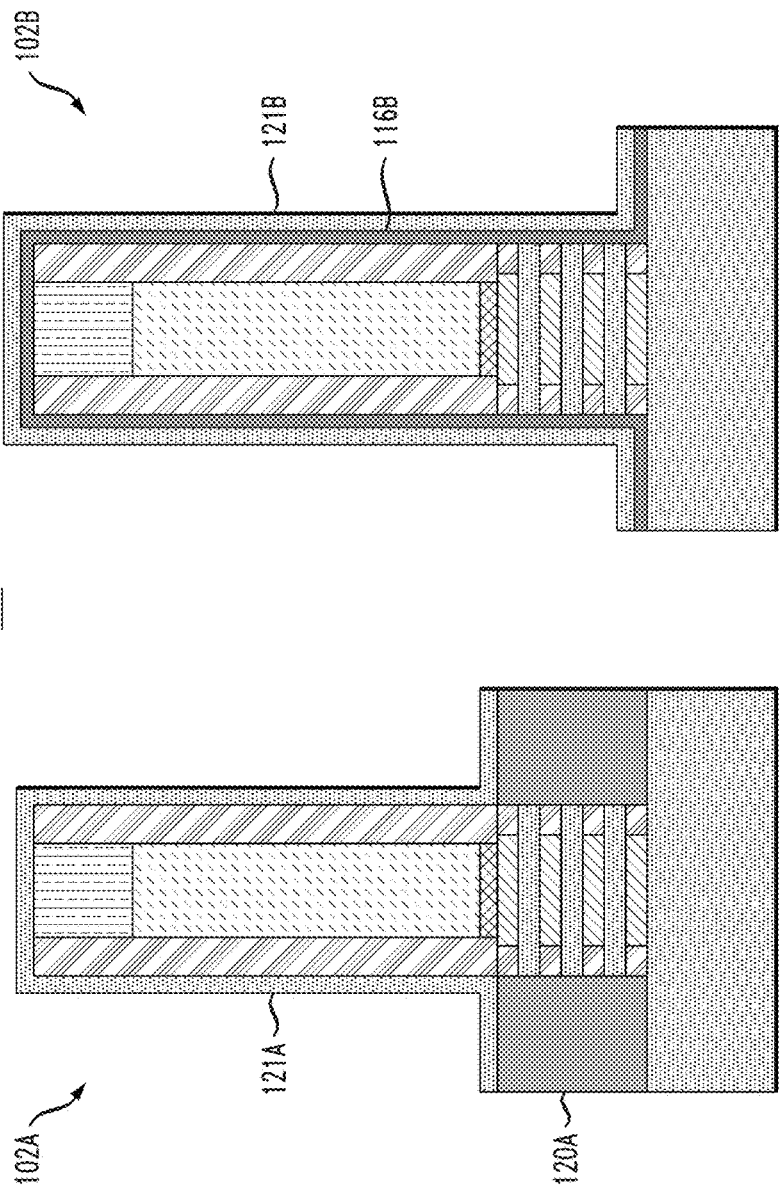
FIG. 1H is a schematic cross-sectional side view of a portion of a semiconductor device at an eighth-intermediate fabrication stage, according to an embodiment of the invention.

FIG. 1H illustrates semiconductor structure 100 at an eighth-intermediate fabrication stage. During this stage, sacrificial liner 121A is deposited on n-FET region 102A and sacrificial liner 121B is deposited on p-FET region 102B (i.e., along sacrificial liner 116B). Sacrificial liner 121A protects the epitaxial layer of source/drain region 120A.

FIG. 1I illustrates semiconductor structure 100 at a ninth-intermediate fabrication stage. During this stage, mask 118A is patterned on sacrificial liner 121A. The function of mask 118A is to protect n-FET region 102A. After mask 118A is patterned on sacrificial liner 121A, sacrificial liners 116B and 121B are removed from p-FET region 102B.

FIG. 1J illustrates semiconductor structure 100 at a tenth-intermediate fabrication stage. During this stage, divots are created within the Si channel of channel region 113B of p-FET region 102B via an etching process, inner spacer material is deposited within the divots (e.g., inner spacer 122B), and mask 118A is removed. In one embodiment, the etching process is isotropic. Inner spacer 122B may be comprised of a silicate glass. For example, inner spacer 122B may be comprised of silicon oxycarbide (SiCO). However, any material may be implemented for use as an inner spacer in accordance with the embodiments described herein. In one embodiment, the width of inner spacer 122B is smaller than the width of inner spacer 114B to avoid exposing the SiGe channel of channel region 113B. Accordingly, conformal liner deposition is performed to create a SiCO inner spacer for the Si channel of channel region 113B.

Figure 1K:
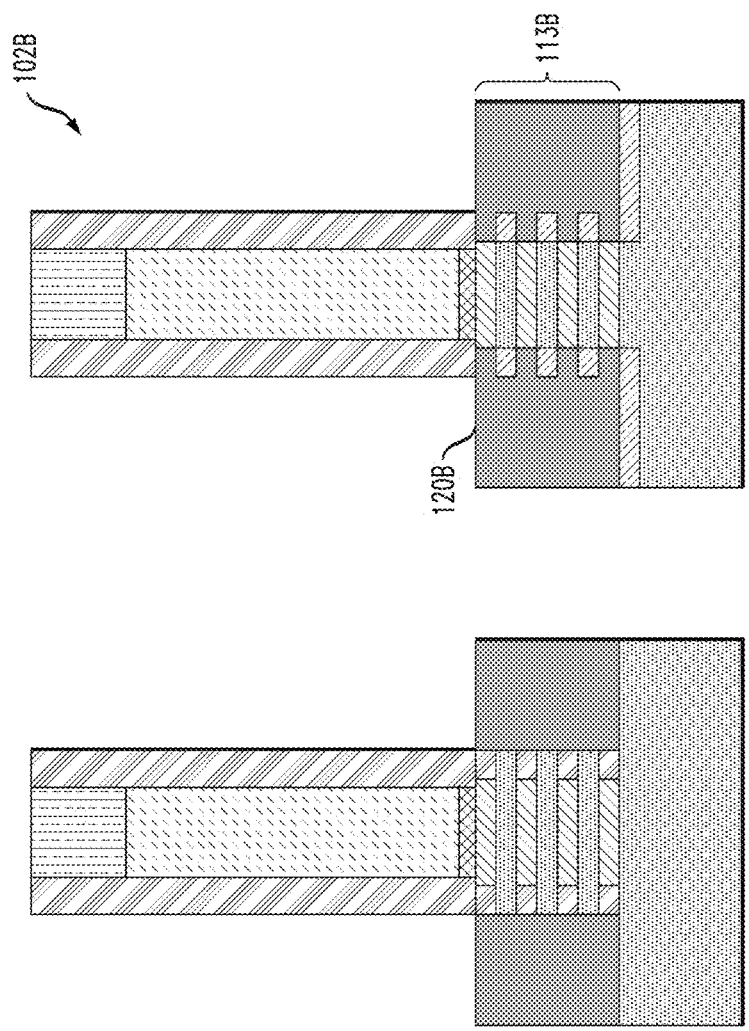
FIG. 1K is a schematic cross-sectional side view of a portion of a semiconductor device at an eleventh-intermediate fabrication stage, according to an embodiment of the invention.
Figure 10:
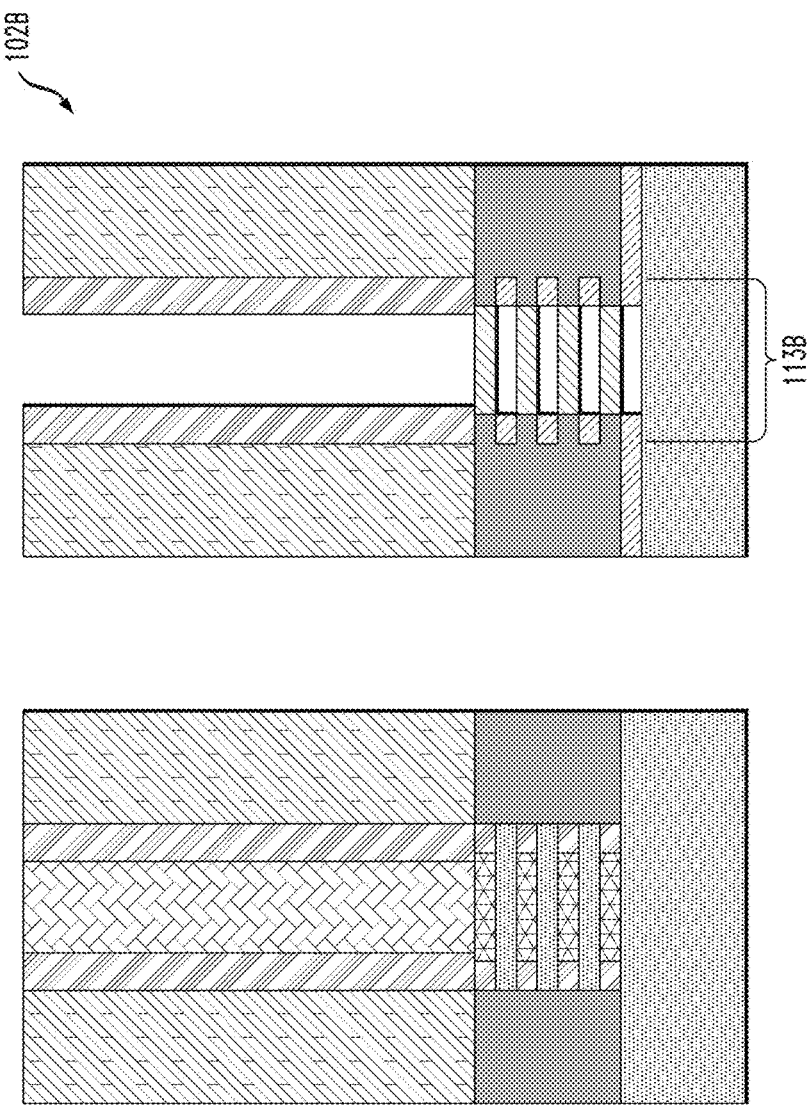

FIG. 1K illustrates semiconductor structure 100 at an eleventh-intermediate fabrication stage. During this stage, inner spacer 114B is removed, and source/drain region 120B of p-FET region 102B is created by growing an epitaxial layer along the SiGe channel of channel region 113B of p-FET region 102B, as shown. In one embodiment, the epitaxial layer along the SiGe channel of channel region 113B is grown via high temperature epitaxy with Ge implantation. After source/drain region 120B is created, mask 118A is removed.

FIG. 1L illustrates semiconductor structure 100 at a twelfth-intermediate fabrication stage. During this stage, interlayer dielectric 128A is formed on source/drain region 120A of n-FET region 102A, and interlayer dielectric 128B is formed on source/drain region 120B of p-FET region 102B. In one embodiment, interlayer dielectric 128A and interlayer dielectric 128B are comprised of an oxide. However, interlayer dielectrics 128A and 128B may be comprised of any dielectric material in accordance with the embodiments described herein.

FIG. 1M illustrates semiconductor structure 100 at a thirteenth-intermediate fabrication stage. During this stage, a polysilicon pull process, or "poly-pull" process, is performed to remove the gate from n-FET region 102A, and a channel release is performed to remove the SiGe portion of channel region 113A. In one embodiment, performing the poly-pull process and channel release comprises performing an isotropic SiGe etch selective to Si.

FIG. 1N illustrates semiconductor structure 100 at a fourteenth-intermediate fabrication stage. During this stage, work function metal 130A is deposited in channel region 113A to replace the channel released from channel region 113A. In one embodiment, work function metal 130A is deposited via a conformal atomic layer deposition (ALD) process. As further shown, metal 132A is deposited to replace gate 108A. Metal 132A may be tungsten (W), but any metal may be used in accordance with the embodiments described herein. In one embodiment, metal 132A is deposited via a chemical vapor deposition (CVD) process. For example, metal 132A may be deposited via plasma-enhanced CVD (PECVD). A chemical mechanical planarization (CMP) may be performed after metal 132A is deposited.

FIG. 1O illustrates semiconductor structure 100 at a fifteenth-intermediate fabrication stage. During this stage, a "poly-pull" process is performed to remove the gate from p-FET region 102B, and a channel release is performed to remove the Si portion of channel region 113B.

FIG. 1P illustrates semiconductor structure 100 at a sixteenth-intermediate fabrication stage. During this stage, work function metal 130B is deposited in channel region 113A to replace the Si channel released from channel region 113B. In one embodiment, work function metal 130B is deposited via a conformal ALD process. As further shown, metal 132B is deposited to replace gate 108B. Metal 132B may be W, but any metal may be used in accordance with the embodiments described herein. In one embodiment, metal 132B is deposited via a CVD process. For example, metal 132B may be deposited via PECVD. A chemical mechanical planarization (CMP) may be performed after metal 132B is deposited.

FIG. 1Q illustrates semiconductor structure 100 at a seventeenth-intermediate fabrication stage. During this stage, metal 132A and metal 132B are recessed, and gate cap layers 134A and 134B are formed on n-FET region 102A and p-FET region 102B, respectively, to create a self-aligned source/drain contact. In one embodiment, gate cap layers 134A and 134B are formed by etching metal 132A and 132B to form recesses and depositing gate cap material within the recesses. A CMP process may be performed to remove excess portions of the deposited gate cap material (i.e., to remove overflow material). The gate cap material may be comprised of silicon mononitride (SiN). However, any material may be used as gate cap material in accordance with the embodiments described herein. Accordingly, the embodiments described herein provide for a method for fabricating a hybrid channel nanosheet FET.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for fabricating a nanosheet semiconductor structure, the method comprising:
   forming a first nanosheet field effect transistor (FET) structure having a first inner spacer comprised of a first material and a second nanosheet FET structure having a second inner spacer comprised of a second material;
   wherein the first material is different than the second material, and
   further wherein forming the first nanosheet FET structure and the second nanosheet FET structure comprises:
       creating a first inner spacer formation within a first silicon germanium (SiGe) channel, wherein the first SiGe channel is comprised in a first channel region of a first FET region; and
       creating a second inner spacer formation within a second SiGe channel, wherein
   the second SiGe channel is comprised in a second channel region of a second FET region,
   wherein the first SiGe channel is formed from one or more first SiGe nanosheets, and wherein the second SiGe channel is formed from one or more second SiGe nanosheets, and
   wherein creating the first inner spacer formation comprises forming a first divot within the first SiGe channel and filling the first divot with a first ceramic material, wherein creating the second inner spacer formation comprises forming a second divot within the second SiGe channel and filling the second divot with a second ceramic material.

2. The method of claim 1, where in the first nanosheet FET structure is an n-type FET structure and the second nanosheet FET structure is a p-type FET structure.

3. The method of claim 1, wherein at least one of the first and second channel regions is formed via etching.

4. The method of claim 1, wherein at least one of the first and second divots is formed via etching.

5. The method of claim 1, wherein at least one of the first and second ceramic materials is comprised of silicon-boron-carbide-nitride (SiBCN).

6. The method of claim 1, further comprising:
   forming a first stack on the first FET region and a second stack on the second FET region, wherein the first stack comprises a first substrate, the one or more first Si nanosheets, and the one or more first SiGe nanosheets, and wherein the second stack comprises the second substrate, the one or more second Si nanosheets, and the one or more second SiGe nanosheets;
   forming a first pad insulator on the first channel region and a second pad insulator on the second channel region;
   forming a first gate on the first pad insulator and a second gate on the second pad insulator;
   forming a first hard mask on the first gate and a second hard mask on the second gate;
   forming a first spacer on the first channel region, the first gate, and the first hard mask, and a second spacer on the second channel region, the second gate, and the second hard mask, wherein each spacer comprises silicon mononitride (SiN); and
   forming the first channel region from the first stack and the second channel region from the second stack.

7. The method of claim 6, wherein at least one of the first and second substrates is comprised of Si.

8. The method of claim 1, wherein forming the first nanosheet FET structure and the second nanosheet FET structure further comprises:
   depositing a first sacrificial liner on the first FET region and a second sacrificial liner on the second FET region;
   forming a mask on the second sacrificial liner;
   forming a first source/drain region on a first silicon (Si) channel of the first channel region, wherein the first Si channel is formed from one or more first Si nanosheets;
   removing the mask and the first and second sacrificial liners;
   creating a third inner spacer formation within a second Si channel, wherein the second Si channel is comprised in the second channel region, and wherein the second Si channel is formed from one or more second Si nanosheets; and
   forming a second source/drain region on the second SiGe channel.

9. The method of claim 8, wherein creating the third inner spacer region comprises forming a divot within the second Si channel and filling the divot with a silicate glass.

10. The method of claim 9, wherein the silicate glass is silicon oxycarbide (SiCO).

11. The method of claim 8, wherein at least one of the first and second source/drain regions is formed via an epitaxial growth process.

12. The method of claim 8, wherein forming the first nanosheet FET structure and the second nanosheet FET structure further comprises filling the first source/drain region with a first oxide and the second source/drain region with a second oxide.

13. The method of claim 12, wherein forming the first nanosheet FET structure and the second nanosheet FET structure further comprises:
   replacing a first gate of the first FET region with a first metal and the first SiGe channel with a first work function metal; and
   replacing a second gate of the second FET region with a second metal and the second Si channel with a second work function metal.

14. The method of claim 13, wherein the first and second gates are comprised of polysilicon, and wherein replacing the first and second gates comprises removing the first and second gates via a polysilicon pull process.

15. The method of claim 13, wherein replacing the first Si channel comprises performing a Si channel release, and wherein replacing the second SiGe channel comprises performing a SiGe channel release.

16. The method of claim 13, wherein at least one of the first and second metals is comprised of tungsten (W).

17. The method of claim 13, further comprising performing a first chemical mechanical planarization (CMP) process after replacing the first gate and the first Si channel, and a second CMP process after replacing the second gate and the second SiGe channel.

18. The method of claim 1, further comprising forming a first gate cap layer on the first FET region and a second gate cap layer on the second FET region.

* * * * *